US009462726B1

(12) United States Patent
Huang et al.

(10) Patent No.: US 9,462,726 B1
(45) Date of Patent: Oct. 4, 2016

(54) STORAGE UNIT COMBINING MODULE CAPABLE OF LOADING SEVERAL STORAGE UNITS, STORAGE UNIT MOVING SUIT AND RELATED SERVER APPARATUS HAVING SEVERAL STORAGE UNIT COMBINING MODULES

(71) Applicant: Wistron Corporation, New Taipei (TW)

(72) Inventors: Pei-Lin Huang, New Taipei (TW); Kuen-Lin Lee, New Taipei (TW); Yi-Shan Chen, New Taipei (TW); Kuan-Hsun Lu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/841,716

(22) Filed: Sep. 1, 2015

(30) Foreign Application Priority Data

Apr. 16, 2015 (TW) .............................. 104112274 A

(51) Int. Cl.
| | |
|---|---|
| *G06F 1/16* | (2006.01) |
| *H05K 5/00* | (2006.01) |
| *H05K 7/16* | (2006.01) |
| *H05K 7/14* | (2006.01) |
| *H05K 7/18* | (2006.01) |
| *H05K 7/20* | (2006.01) |
| *G06F 1/18* | (2006.01) |

(52) U.S. Cl.
CPC ............. *H05K 7/1492* (2013.01); *G06F 1/187* (2013.01); *H05K 7/1489* (2013.01); *H05K 7/183* (2013.01); *H05K 7/20718* (2013.01)

(58) Field of Classification Search
CPC .. G06F 1/187; H05K 7/1492; H05K 7/1489; H05K 7/183; H05K 7/20718
USPC ....................... 361/679.31–679.39, 724–727; 312/223.1, 223.2
See application file for complete search history.

(56) References Cited

U.S. PATENT DOCUMENTS

| | | | | |
|---|---|---|---|---|
| 5,506,750 A | * | 4/1996 | Carteau ................ | G11B 33/128 361/679.32 |
| 6,459,571 B1 | * | 10/2002 | Carteau ................... | G06F 1/184 312/35 |

(Continued)

*Primary Examiner* — Nidhi Thaker
(74) *Attorney, Agent, or Firm* — Winston Hsu; Scott Margo

(57) ABSTRACT

A storage unit combining module capable of loading a plurality of storage units, and a storage unit moving suit having several storage unit combining modules and a related server apparatus are disclosed. The storage unit combining module includes a base, a circuit backboard and a signal adapter. The base has several positioning zones and an open zone. The circuit backboard includes a first section and a second section bent from each other. The circuit backboard further includes a plurality of connectors respectively disposed on the corresponding positioning zones. The signal adapter is disposed on the open zone and electrically connected to the second section. Two storage units are respectively loaded into two positioning zones on a right side of the base in a first inserting direction, and one storage unit is further loaded into a single positioning zone on a left side of the base in a second inserting direction.

31 Claims, 11 Drawing Sheets

(56) References Cited

U.S. PATENT DOCUMENTS

| | | | | |
|---|---|---|---|---|
| 9,351,421 B2* | 5/2016 | Lee | | H05K 7/1487 |
| 2003/0147220 A1* | 8/2003 | Fairchild | | G06F 1/184 |
| | | | | 361/726 |
| 2004/0088482 A1* | 5/2004 | Tanzer | | G11B 33/128 |
| | | | | 711/114 |
| 2007/0230109 A1* | 10/2007 | Starr | | G11B 33/128 |
| | | | | 361/679.31 |
| 2011/0090635 A1* | 4/2011 | Liu | | G11B 33/124 |
| | | | | 361/679.33 |
| 2013/0050955 A1* | 2/2013 | Shinsato | | G06F 1/181 |
| | | | | 361/727 |
| 2014/0204525 A1* | 7/2014 | Pecone | | H05K 13/00 |
| | | | | 361/679.33 |
| 2015/0173234 A1* | 6/2015 | Lee | | G11B 33/128 |
| | | | | 361/679.33 |
| 2016/0095246 A1* | 3/2016 | Noland | | H05K 7/1489 |
| | | | | 361/679.31 |
| 2016/0128223 A1* | 5/2016 | Fu | | H05K 7/1487 |
| | | | | 361/679.31 |

* cited by examiner

STORAGE UNIT COMBINING MODULE CAPABLE OF LOADING SEVERAL STORAGE UNITS, STORAGE UNIT MOVING SUIT AND RELATED SERVER APPARATUS HAVING SEVERAL STORAGE UNIT COMBINING MODULES

BACKGROUND OF THE INVENTION

1. Field of the Invention

The present invention relates to a server apparatus capable of loading a plurality of storage units, and more particularly, to a storage unit combining module Capable of loading a plurality of storage units, and a storage unit moving suit and a related server apparatus having a plurality of storage unit combining modules.

2. Description of the Prior Art

A conventional 4U tower-typed server apparatus only loads thirty-two hard disk units within the apparent surface area of the server apparatus due to universal constraint of the housing. The housing of the 4U server apparatus includes eight frames disposed close to each other, and each frame can load four hard disk units arranged in parallel. The 4U server apparatus has four hard disk backboards respectively disposed on the same plane on a rear of the frame, and each hard disk backboard covers scope of two frames. Eight hard disk connectors are disposed on an outer surface of the hard disk backboard side by side, to vertically connect with the adjacent eight hard disk units at most. A vent hole is formed on position of the hard disk backboard between the adjacent hard disk connectors for heat dissipation. A power connector and a signal connector are disposed on an inner surface of the hard disk backboard. The signal connector can be connected to a RAID card for establishing connection between the hard disk backboard and the RAID card, and further can be connected to a mainboard by the cable. The power connector is connected to the mainboard by the cable.

Shortcomings of the conventional 4U tower-typed server apparatus is that the hard disk units are arranged in the frame side by side to expose the same edges of the whole hard disk units through the front of the frame, the user can watch all the hard disk units in a front view and conveniently remove or insert one or more hard disk units into the frames, so that an amount of the hard disk unit is constrained by the apparent surface area of the server apparatus. Moreover, circuit allocation space on the hard disk backboard is decreased because of the vent holes, and electronic components are difficult to lay on the hard disk backboard in double-sided product process to detour the vent holes. Therefore, the hard disk backboard of the conventional 4U tower-typed server apparatus is applied to load eight hard disk units, and has drawbacks of huge volume, difficult product process, expensive cost and inconvenient repair and replacement.

SUMMARY OF THE INVENTION

The present invention provides a storage unit combining module Capable of loading a plurality of storage units, and a storage unit moving suit and a related server apparatus having a plurality of storage unit combining modules for solving above drawbacks.

According to the claimed invention, a storage unit combining module capable of simultaneously loading a first storage unit, a second storage unit and a third storage unit is disclosed. The storage unit combining module includes a base and a circuit backboard. The base includes a first positioning zone, a second positioning zone and a third positioning zone and defines a first inserting direction and a second inserting direction crossed each other. Stretching directions of the first positioning zone and the second positioning zone are parallel to the first inserting direction, and the first positioning zone is neighbored with the second positioning zone in the second inserting direction. A stretching direction of the third positioning zone is parallel to the second inserting direction and neighbored with identical lateral sides of the first positioning zone and the second positioning zone in the first inserting direction. The circuit backboard is disposed on the base. The circuit backboard includes a first section and a second section connected to each other. The first section is located between the third positioning zone and the identical lateral sides of the first positioning zone and the second positioning zone and stretches toward a direction opposite to the second inserting direction. The second section stretches toward the first inserting direction and is neighbored with a side of the third positioning zone. The circuit backboard includes a first connector disposed on a position of the first section neighbored with and facing the first positioning zone, a second connector disposed on a position of the first section neighbored with and facing the second positioning zone, a third connector disposed on a position of the second section neighbored with and facing the third positioning zone, and a signal adapter for connecting with a pass-through interface card. The first storage unit is adapted to connect with the first connector in the first inserting direction through the first positioning zone, the second storage unit is adapted to connect with the second connector in the first inserting direction through the second positioning zone, and the third storage unit is adapted to connect with the third connector in the second inserting direction through the third positioning zone.

According to the claimed invention, a storage unit moving suit includes a carrying frame, a pass-through interface card and at least one storage unit combining module. The carrying frame has an accommodating space. The pass-through interface card is disposed on a side of the carrying frame. The at least one storage unit combining module is disposed inside the accommodating space of the carrying frame and capable of simultaneously loading a first storage unit, a second storage unit and a third storage unit. The at least one storage unit combining module includes a base and a circuit backboard. The base includes a first positioning zone, a second positioning zone and a third positioning zone and defines a first inserting direction and a second inserting direction crossed each other. Stretching directions of the first positioning zone and the second positioning zone are parallel to the first inserting direction, and the first positioning zone is neighbored with the second positioning zone in the second inserting direction. A stretching direction of the third positioning zone is parallel to the second inserting direction and neighbored with identical lateral sides of the first positioning zone and the second positioning zone in the first inserting direction. The circuit backboard is disposed on the base. The circuit backboard includes a first section and a second section connected to each other. The first section is located between the third positioning zone and the identical lateral sides of the first positioning zone and the second positioning zone and stretches toward a direction opposite to the second inserting direction. The second section stretches toward the first inserting direction and is neighbored with a side of the third positioning zone. The circuit backboard includes a first connector disposed on a position of the first section neighbored with and facing the first positioning zone, a second connector disposed on a position of the first section neighbored with and facing the second positioning zone, a third connector disposed on a position of the second section neighbored with and facing the third positioning zone, and a signal adapter for connecting with a pass-through interface card. The first storage unit is adapted to connect with the first connector in the first inserting direction through the first positioning zone, the second storage unit is adapted to connect with the second connector in the first inserting direction through the second positioning zone, and the third storage unit is adapted to connect with the third connector in the second inserting direction through the third positioning zone.

According to the claimed invention, a server apparatus includes a housing, a mainboard and at least one storage unit moving suit. The mainboard is disposed inside the housing. The at least one storage unit moving suit is loaded inside the housing and capable of being pulled or pushed relative to the housing. The at least one storage unit moving suit includes a carrying frame, a pass-through interface card and at least one storage unit combining module. The carrying frame has an accommodating space. The pass-through interface card is disposed on a side of the carrying frame. The at least one storage unit combining module is disposed inside the accommodating space of the carrying frame and capable of simultaneously loading a first storage unit, a second storage unit and a third storage unit. The at least one storage unit combining module includes a base and a circuit backboard. The base includes a first positioning zone, a second positioning zone and a third positioning zone and defines a first inserting direction and a second inserting direction crossed each other. Stretching directions of the first positioning zone and the second positioning zone are parallel to the first inserting direction, and the first positioning zone is neighbored with the second positioning zone in the second inserting direction. A stretching direction of the third positioning zone is parallel to the second inserting direction and neighbored with identical lateral sides of the first positioning zone and the second positioning zone in the first inserting direction. The circuit backboard is disposed on the base. The circuit backboard includes a first section and a second section connected to each other. The first section is located between the third positioning zone and the identical lateral sides of the first positioning zone and the second positioning zone and stretches toward a direction opposite to the second inserting direction. The second section stretches toward the first inserting direction and is neighbored with a side of the third positioning zone. The circuit backboard includes a first connector disposed on a position of the first section neighbored with and facing the first positioning zone, a second connector disposed on a position of the first section neighbored with and facing the second positioning zone, a third connector disposed on a position of the second section neighbored with and facing the third positioning zone, and a signal adapter for connecting with a pass-through interface card. The first storage unit is adapted to connect with the first connector in the first inserting direction through the first positioning zone, the second storage unit is adapted to connect with the second connector in the first inserting direction through the second positioning zone, and the third storage unit is adapted to connect with the third connector in the second inserting direction through the third positioning zone.

The storage unit combining module and the related storage unit moving suit of the present invention can increase the loading amounts of the storage unit while volume of the server apparatus is unvaried. The circuit backboard of the storage unit combining module does not have the vent holes to increase circuit allocation space on the circuit backboard. The hard disk connector, the power connector and the signal connector are not disposed on two surfaces of the circuit backboard, and the single-sided product process can be applied to effectively economize manufacture cost of the circuit backboard. The storage unit moving suit is connected to the mainboard by the flexible cable, so the storage unit moving suit can be pulled out and pushed into the housing for replacement of the storage units while the server apparatus is in normal operation. Each storage unit combining module is matched with three storage units, and a quantity of the hard disks within the server apparatus can be highly changeable for customized demand.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
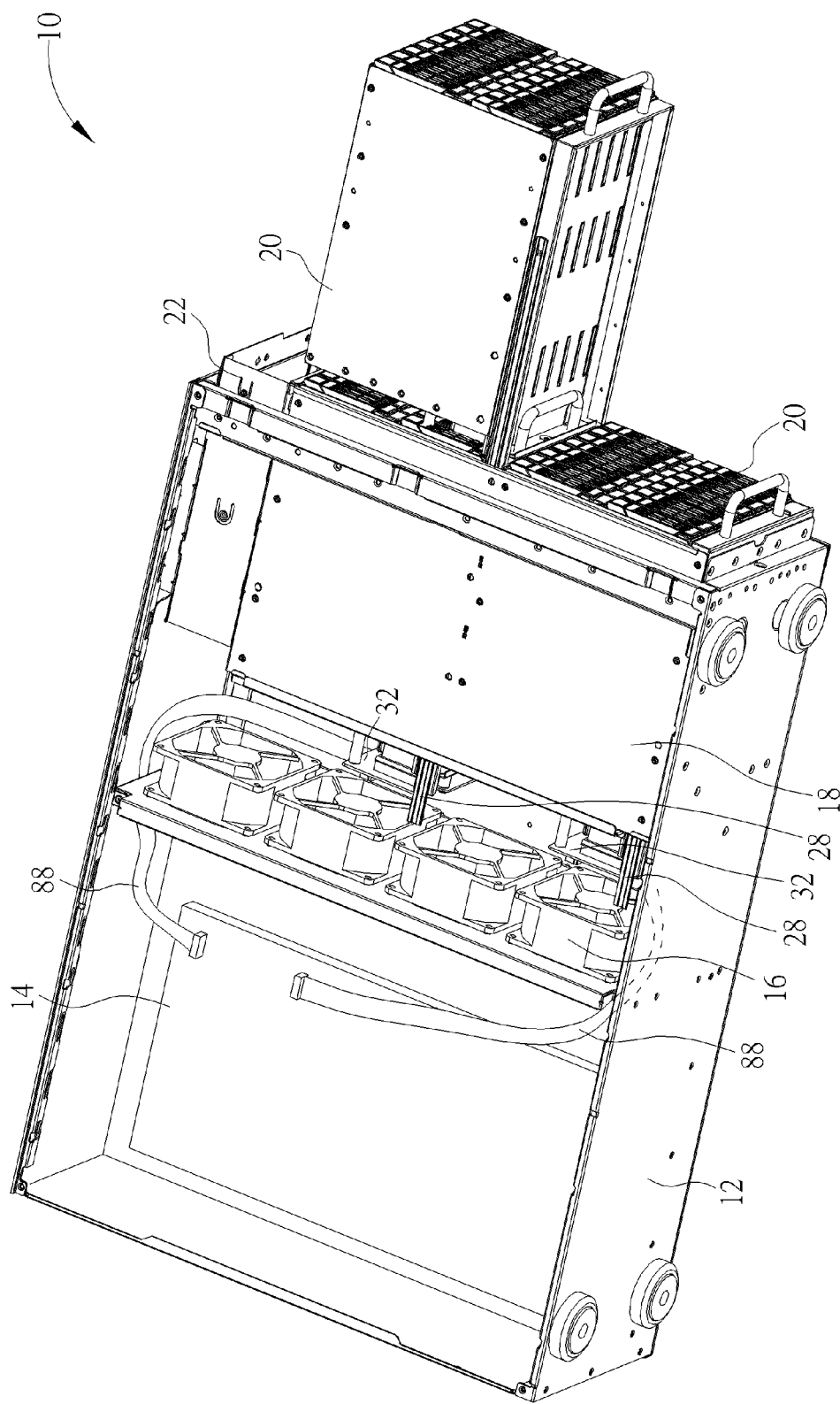
FIG. 1 and FIG. 2 respectively are diagrams of a server apparatus with storage unit moving suits in different operational modes according to an embodiment of the present invention.
Figure 2:
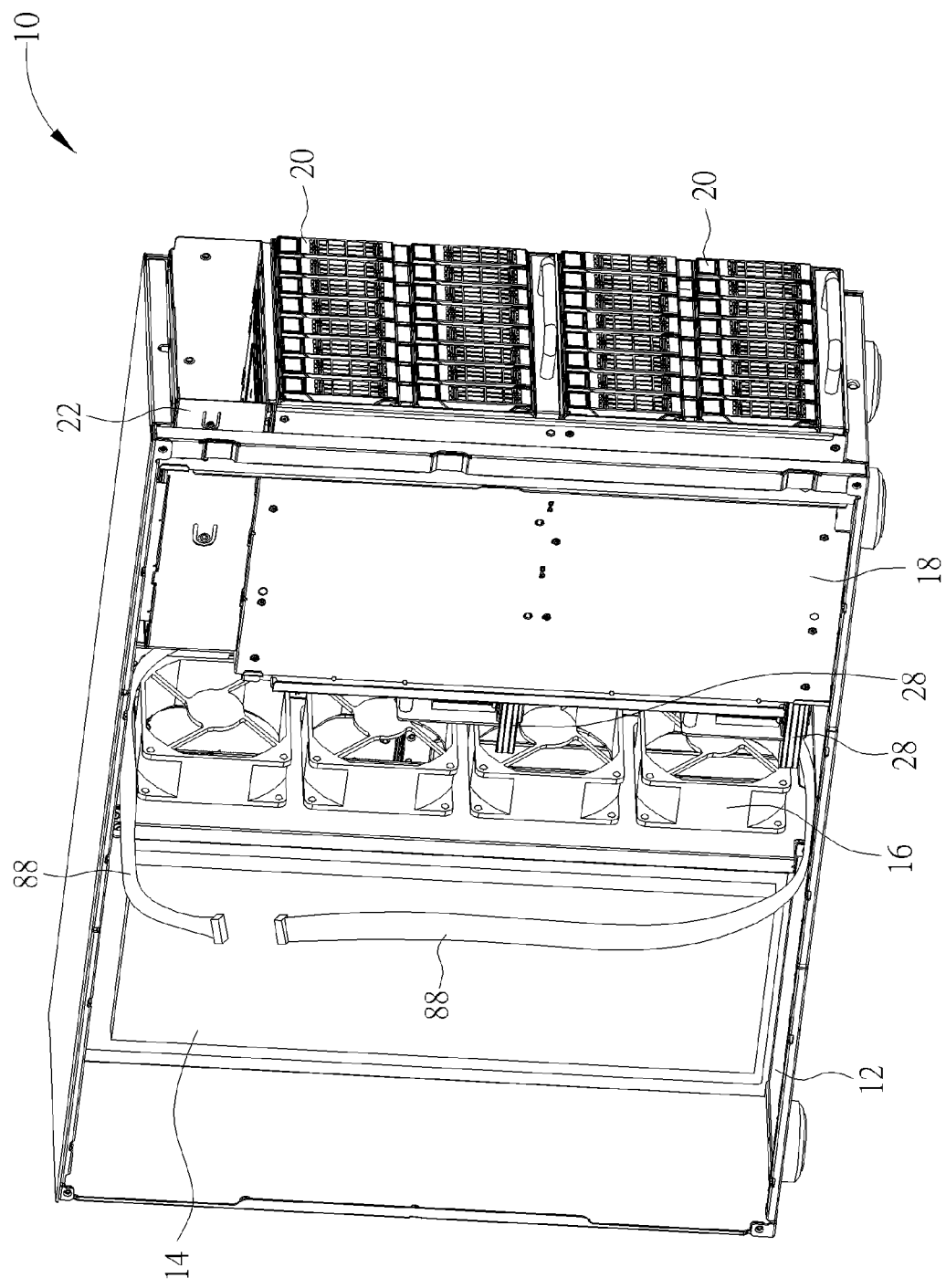
Figure 3:
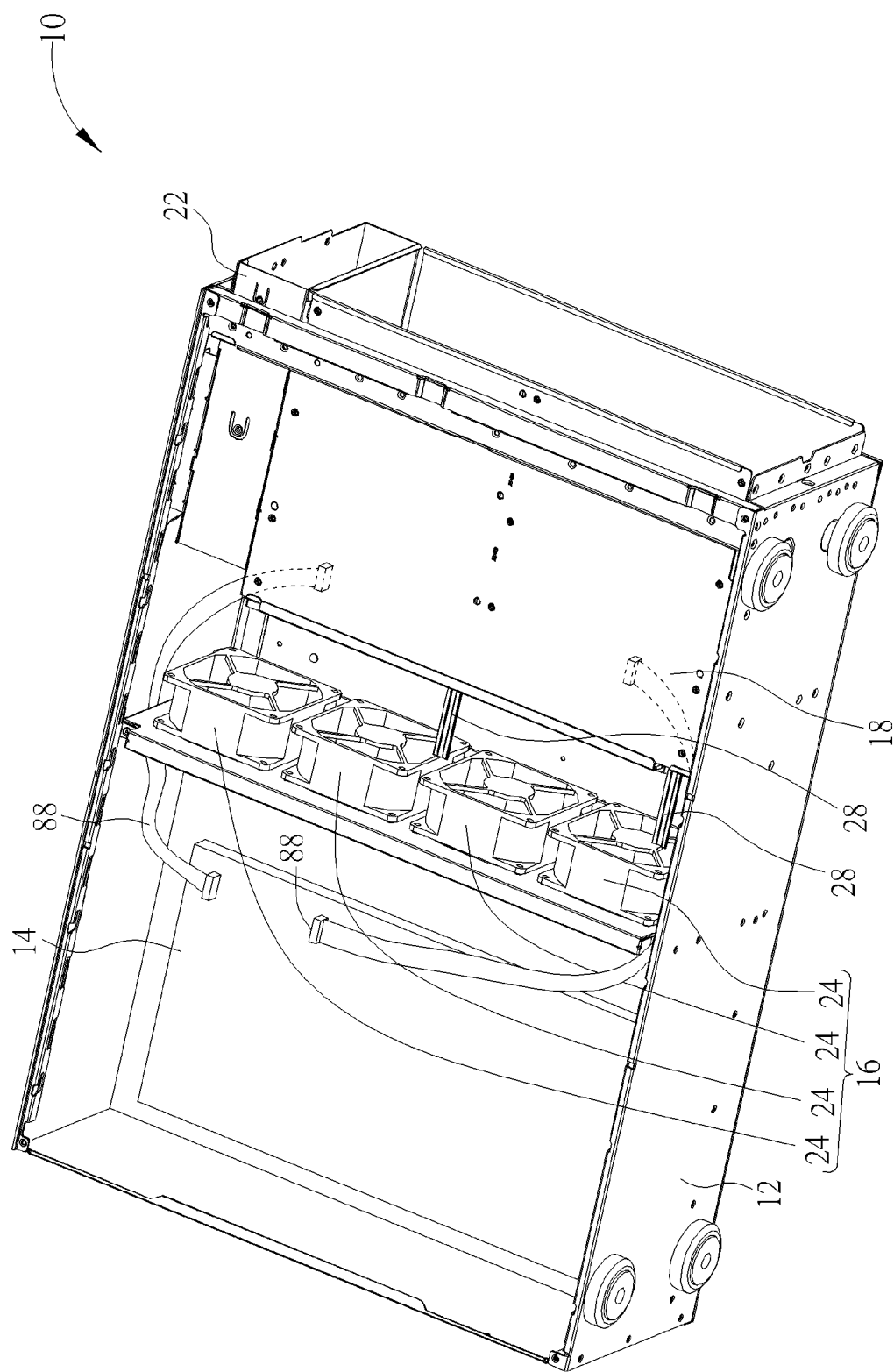
FIG. 3 is a diagram of the server apparatus without the storage unit moving suit according to the embodiment of the present invention.

Please refer to FIG. 1 to FIG. 3. FIG. 1 and FIG. 2 respectively are diagrams of a server apparatus 10 with several storage unit moving suits 20 in different operational modes according to an embodiment of the present invention. FIG. 3 is a diagram of the server apparatus 10 without the storage unit moving suit 20 according to the embodiment of the present invention. The server apparatus 10 includes a housing 12, a mainboard 14, a heat dissipating module 16 and a bridging frame 18. The mainboard 14 is disposed on a rear of the housing 12, the bridging frame 18 is disposed on a front of the housing 12, and the heat dissipating module 16 is located between the mainboard 14 and the bridging frame 18. Further, the bridging frame 18 can be disposed on the rear of the housing 12 to locate the mainboard 14 between the heat dissipating module 16 and the bridging frame 18. A plurality of storage unit moving suits 20 can be simultaneously loaded inside the bridging frame 18, and the embodiment installs two storage unit moving suits 20, but not limited to, inside the bridging frame 18. A gap between the bridging frame 18 and the housing 12 can be utilized to dispose a datum reading module 22, such as an optical disk drive. The heat dissipating module 16 includes a plurality of fan units 24 respectively aligning with the storage unit moving suits 20 and/or the mainboard 14, to dissipate heat generated from the storage unit moving suits 20 and the mainboard 14 by cooling airflow of the heat dissipating module 16.

Figure 4:
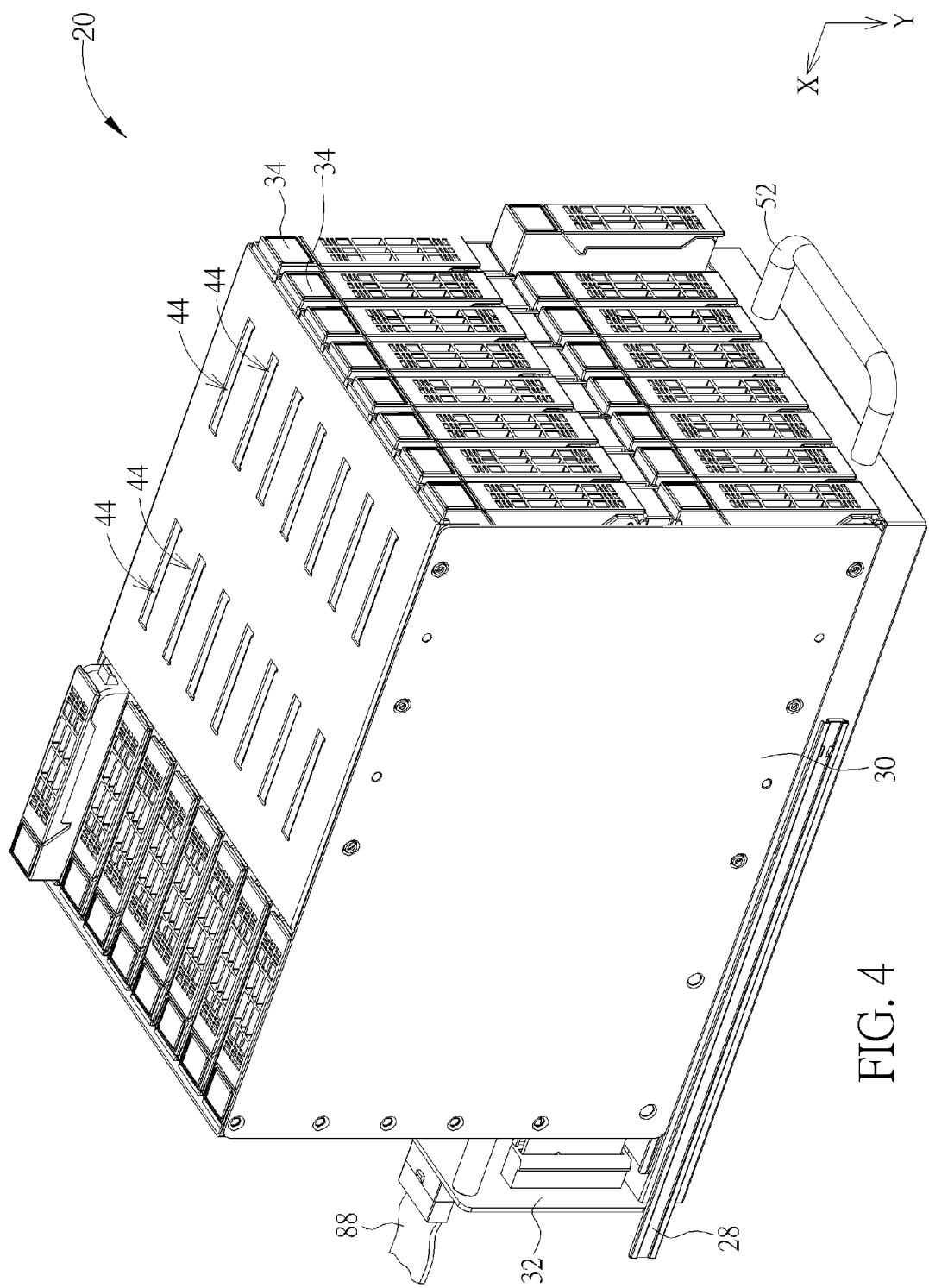
FIG. 4 and FIG. 5 respectively are diagrams of the storage unit moving suit with storage unit combining modules in different views according to the embodiment of the present invention.
Figure 5:
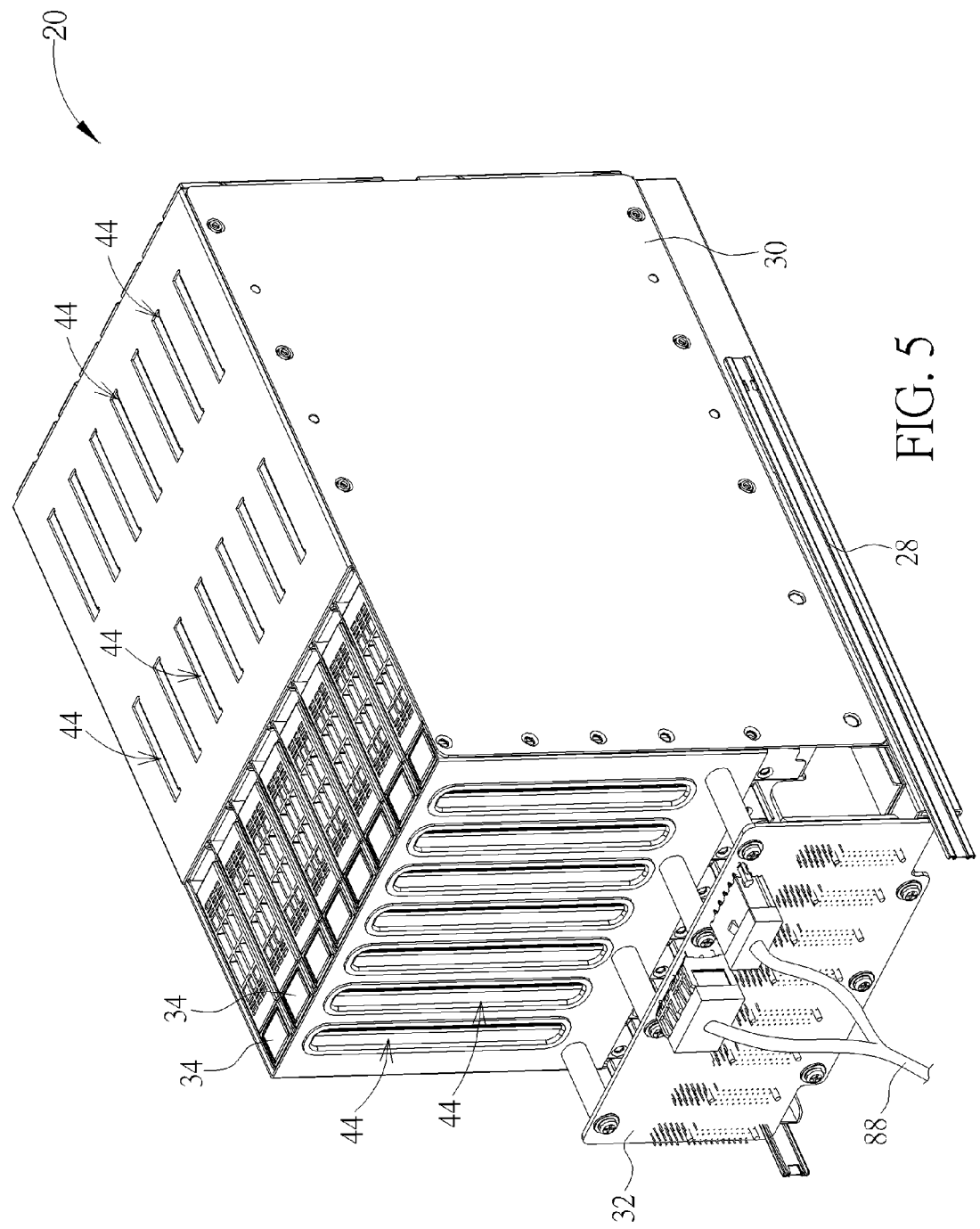
Figure 6:
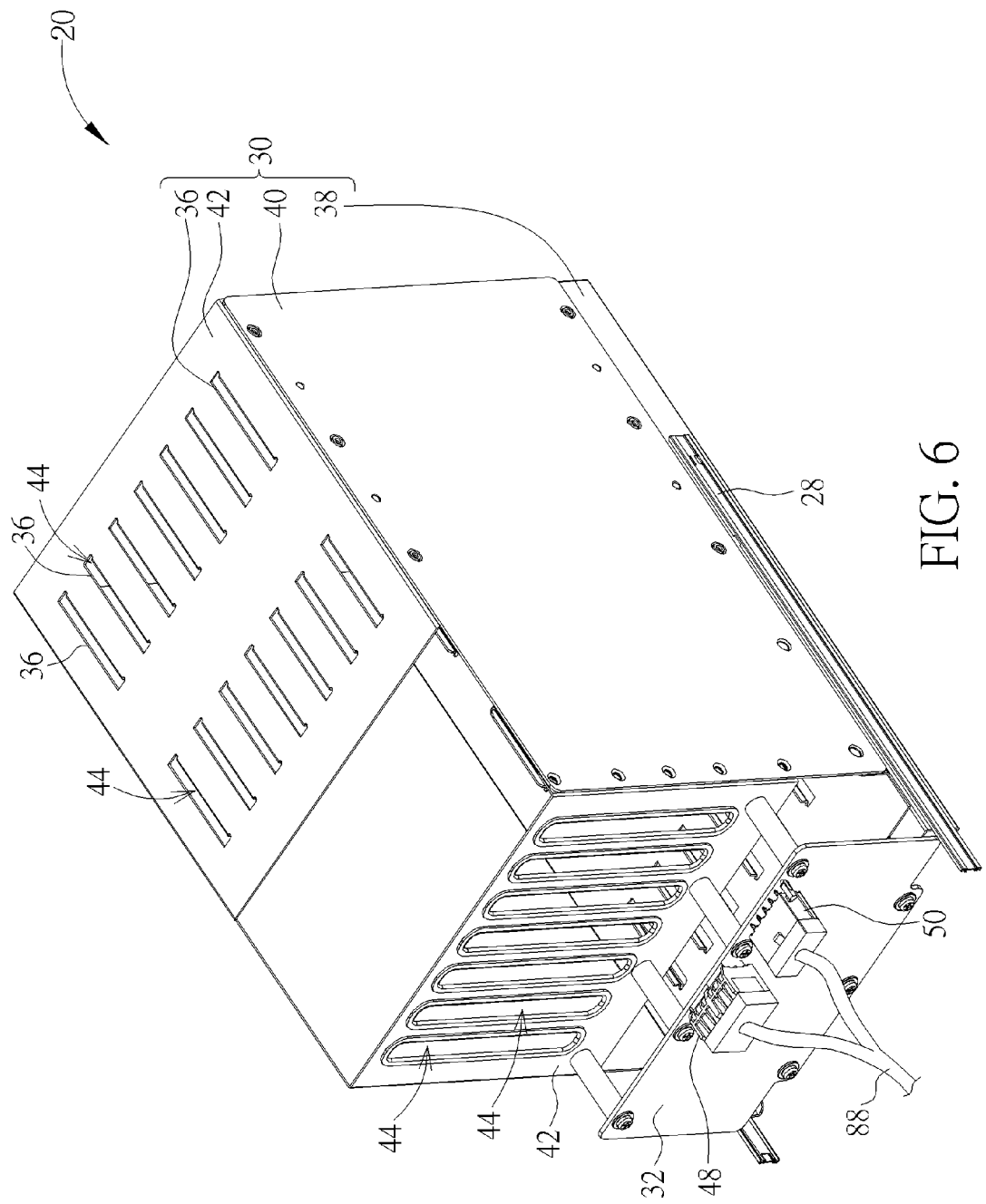
FIG. 6 and FIG. 7 respectively are diagrams of the storage unit moving suit without the storage unit combining module in different views according to the embodiment of the present invention.
Figure 7:
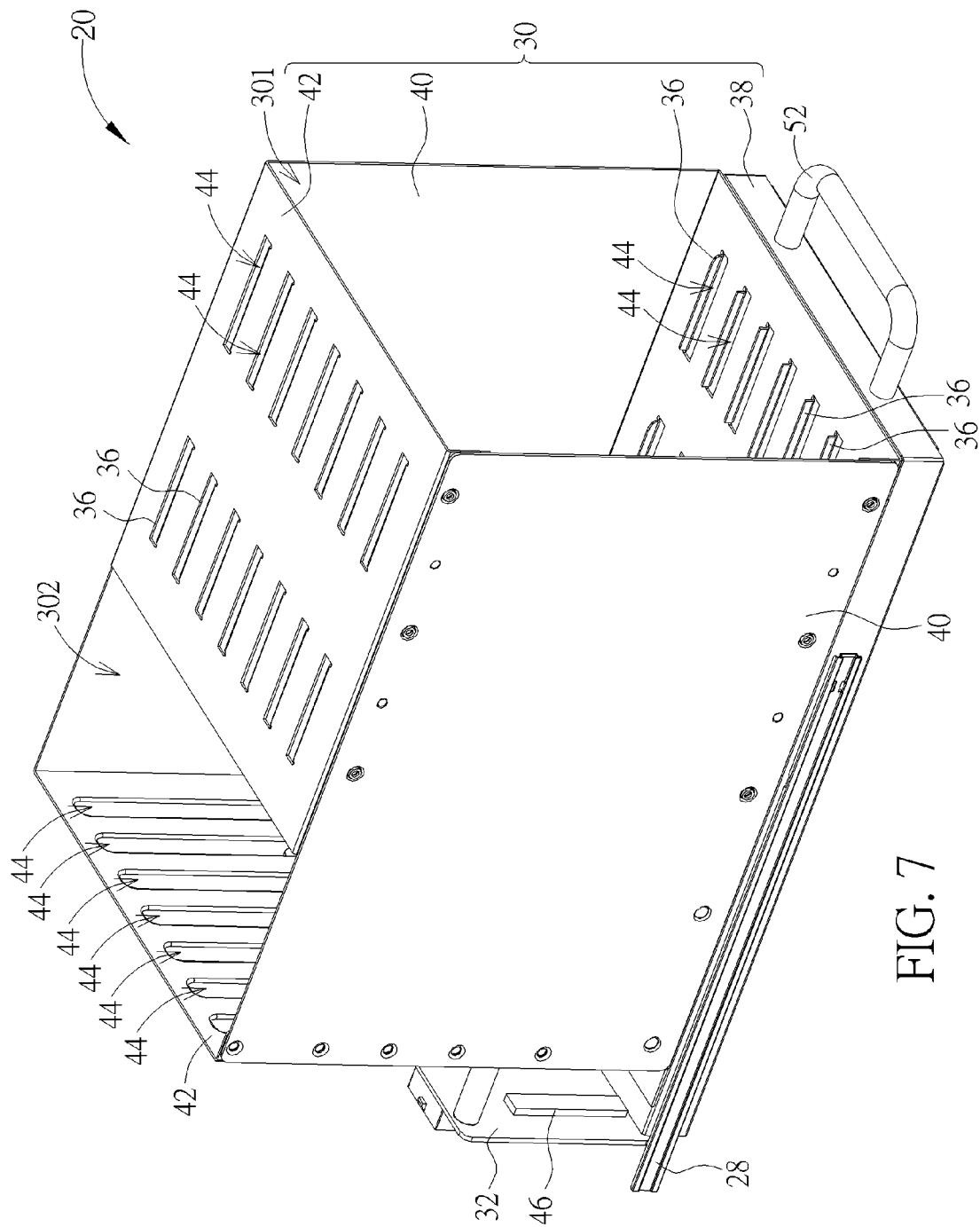
Figure 8:
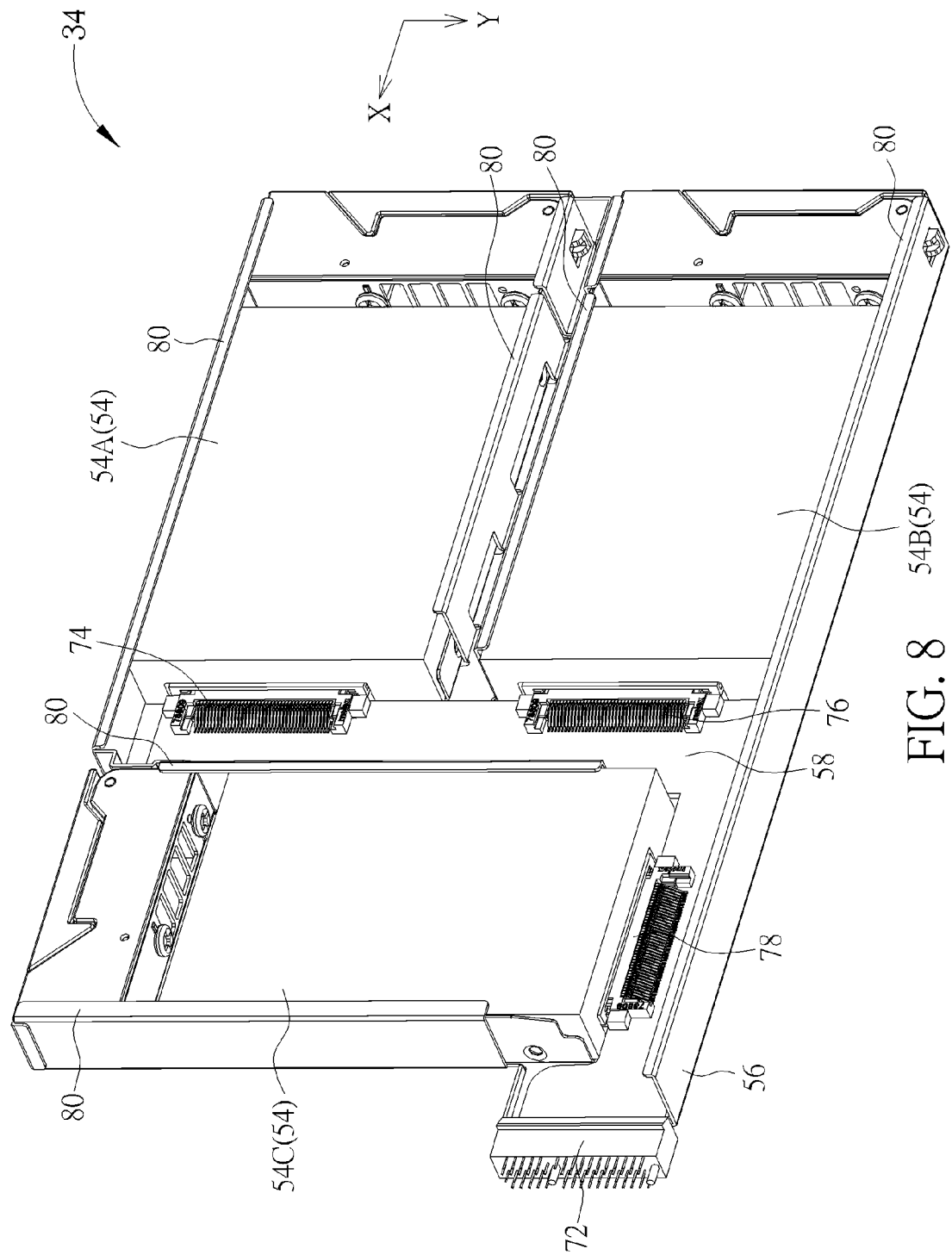
FIG. 8 is a diagram of the storage unit combining module with storage units according to the embodiment of the present invention.

The server apparatus 10 further includes a pass-through interface card and a slide rail structure 28, and the pass-through interface card is a RAID (redundant array of independent disks) card 32. The slide rail structure 28 is disposed between the bridging frame 18 and storage unit moving suit 20 (which is loaded inside a carrying frame 30 shown in FIG. 4 to FIG. 7), and the storage unit moving suit 20 can move relative to the bridging frame 18 by the slide rail structure 28 to pull out or to push the storage unit moving suit 20 into the housing 12. The RAID card 32 is disposed on the storage unit moving suit 20 (which can be shown in FIG. 4 to FIG. 7), and can move along the slide rail structure 28 with a movement of the storage unit moving suit 20. In the embodiment of the present invention, the RAID card 32 is disposed on a back of the storage unit moving suit 20; however, in another embodiment, the RAID card 32 can be disposed on a bottom of the storage unit moving suit 20, which means position of the RAID card 32 is varied according to position of a signal adapter 72 of the storage unit combining module 34, as shown in FIG. 8. In addition, the RAID card 32 is electrically connected to the mainboard 14 via a flexible cable 88. The flexible cable 88 preferably detours the heat dissipating module 16, and two ends of the flexible cable 88 can be electrically connected to the mainboard 14 and the RAID card 32. Due to deflection and stretchability of the flexible cable 88, the storage unit moving suit 20 can be arbitrarily pulled out of the housing 12 (or out of the bridging frame 18) for repair of inner components (such as replacing the hard disk) while the server apparatus 10 is in normal operation Please refer to FIG. 1 to FIG. 7. FIG. 4 and FIG. 5 respectively are diagrams of the storage unit moving suit 20 with the storage unit combining module 34 in different views according to the embodiment of the present invention. FIG. 6 and FIG. 7 respectively are diagrams of the storage unit moving suit 20 without the storage unit combining module 34 in different views according to the embodiment of the present invention. The storage unit moving suit 20 includes a carrying frame 30 and the RAID card 32. The carrying frame 30 includes a plurality of guiding slots 36, a bottom slab 38, two lateral slabs 40 and two blocking slabs 42. The lateral slabs 40 are symmetrically connected to sides of the bottom slab 38 to form a U-shaped accommodating space 90. The blocking slabs 42 are respectively crossed between the lateral slabs 40, such as covering a top and a rear of the accommodating space 90, to prevent the storage unit combining module 34 from being separated from the accommodating space 90. The plurality of guiding slots 36 is disposed on the bottom slab 38 and/or the top blocking slab 42 (disposed on the top of the accommodating space 90). The storage unit combining module 34 is slidably disposed inside the carrying frame 30 by the guiding slots 36. A plurality of heat dissipating holes 44 can be respectively formed on the blocking slabs 42 and/or the bottom slab 38.

In the embodiment, the storage unit combining module 34 can move from a front opening of the carrying frame 30 into the carrying frame 30 via the guiding slot 36 while the top blocking slab 42 is assembled with the two lateral slabs 40, so as to connect the storage unit combining module 34 with the RAID card 32. Further, the storage unit combining module 34 can move down from a top opening of the carrying frame 30 to set into the carrying frame 30 while the accommodating space 90 is not sealed, and then the top blocking slab 42 is assembled with the two lateral slabs 40 after the storage unit combining module 34 aligns with the corresponding guiding slot 36 to connect with the RAID card 32. The heat dissipating holes 44 formed on the carrying frame 30 respectively align with the storage units 54, and heat generated by each storage unit 54 (which can be shown in FIG. 8 to FIG. 11) of the storage unit combining module 34 can be effectively dissipated through the heat dissipating holes 44 for preferred heat dissipation efficiency.

Besides, the top blocking slab 42 is substantially parallel to the bottom slab 38, and dimensions of the top blocking slab 42 is smaller than dimensions of the bottom slab 38. The storage units 54 (which can be shown in FIG. 8 to FIG. 11) of the storage unit combining module 34 can be moved into or out of the storage unit moving suit 20 in different assembling/disassembling directions through the front opening 301 and the top opening 302 of the carrying frame 30

The RAID card 32 is disposed on a rear of the carrying frame 30, such as the rear of the accommodating space 90. A plurality of sockets 46 is disposed on a surface of the RAID card 32 facing the carrying frame 30 for connecting with the signal adapter 72 (which can be shown in FIG. 8 and FIG. 9) of the storage unit combining module 34, and an amount of the socket 46 corresponds to an amount of the storage unit combining module 34. In the embodiment, the RAID card 32 has eight sockets 46, but not limited to, and the storage unit moving suit 20 can load eight storage unit combining modules 34 accordingly. A power connector 48 and a signal connector 50 are disposed on the other surface of the RAID card 32 opposite to the carrying frame 30. The power connector 48 and the signal connector 50 are electrically connected to the mainboard 14 by the flexible cable 88. The carrying frame 30 further includes a handling component 52 disposed on a front of the carrying frame 30. A user can grasp the handling component 52 to move the storage unit moving suit 20 relative to the bridging frame 18 along the slide rail structure 28, so as to pull the storage unit moving suit 20 out or to push the storage unit moving suit 20 into the housing 12.

Figure 9:
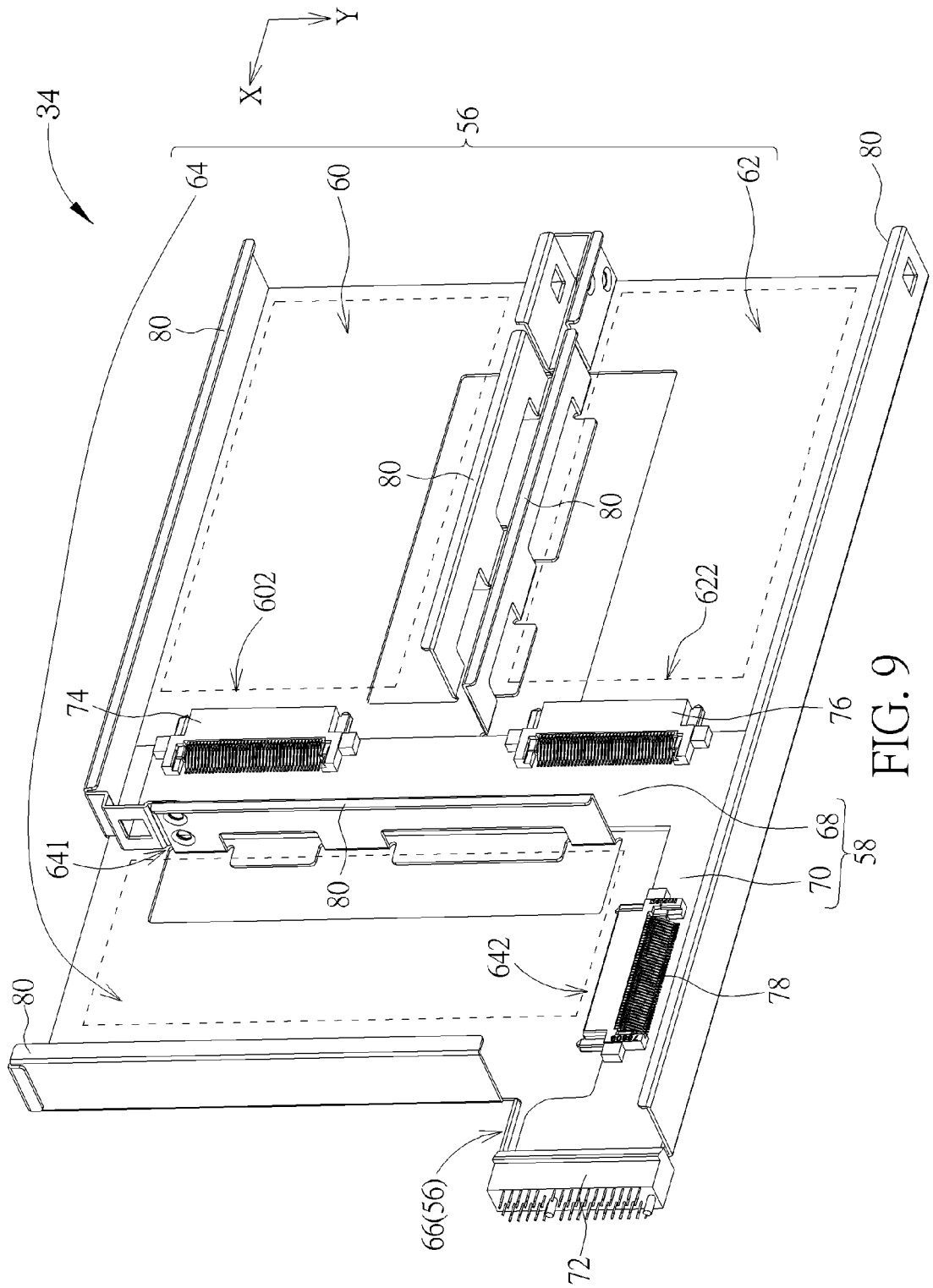
FIG. 9 is a diagram of the storage unit combining module without the storage unit according to the embodiment of the present invention.
Figure 10:
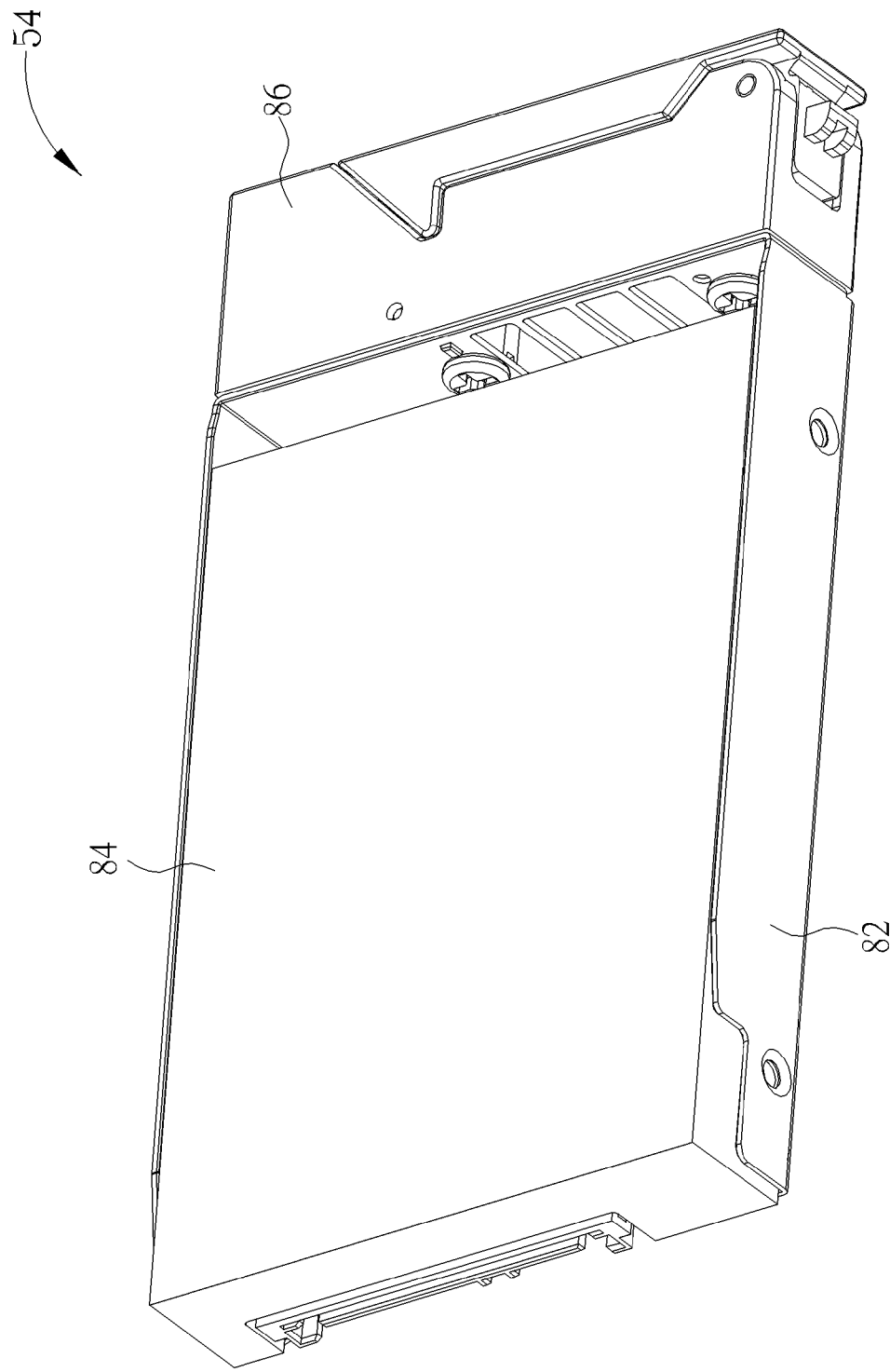
FIG. 10 is a diagram of the storage unit with a storing component according to the embodiment of the present invention.
Figure 11:
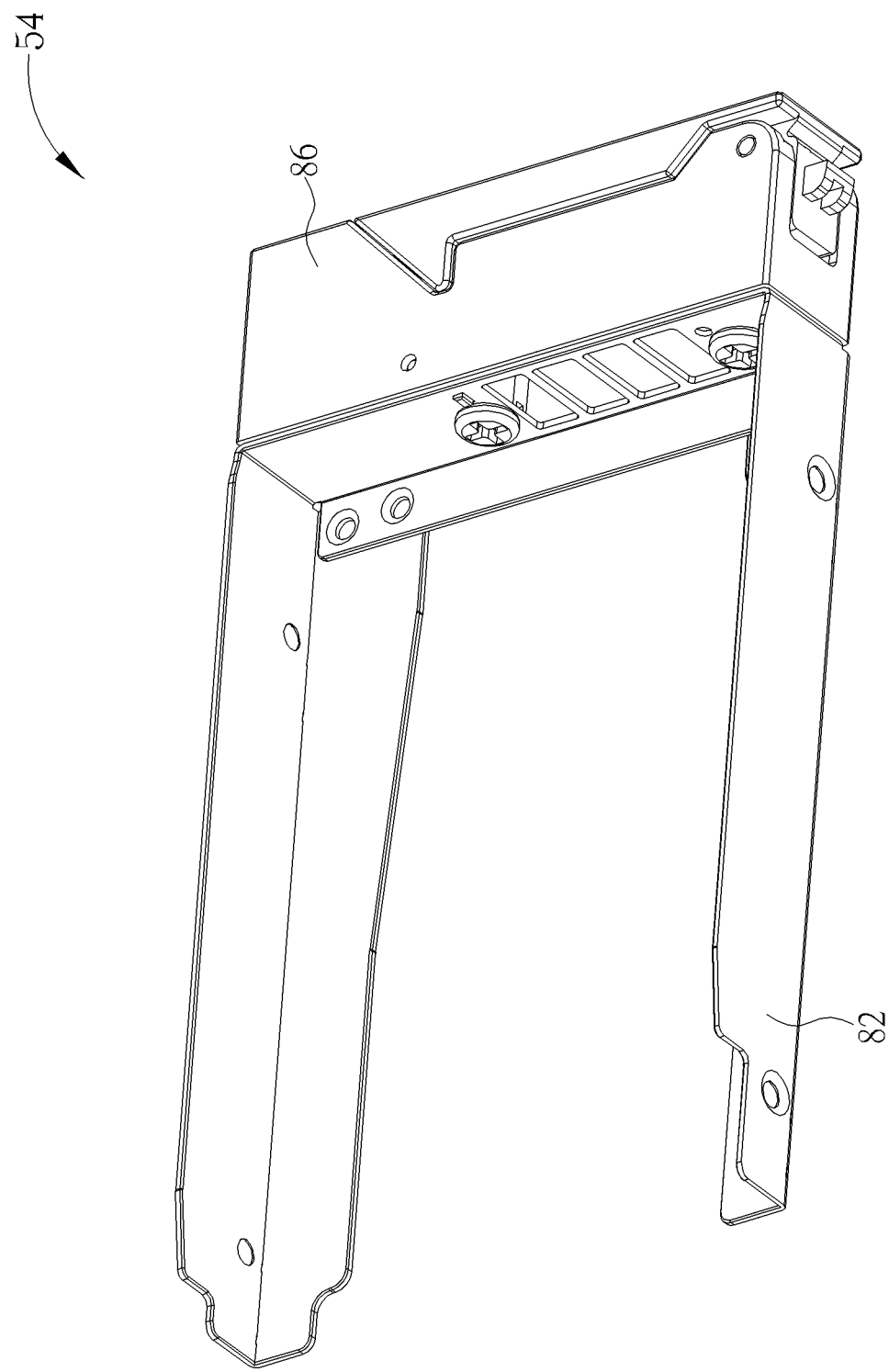
FIG. 11 is a diagram of the storage unit without the storing component according to the embodiment of the present invention.

Please refer to FIG. 1 to FIG. 11. FIG. 8 is a diagram of the storage unit combining module 34 with the storage unit 54 according to the embodiment of the present invention. FIG. 9 is a diagram of the storage unit combining module 34 without the storage unit 54 according to the embodiment of the present invention. FIG. 10 is a diagram of the storage unit 54 with a storing component 84 according to the embodiment of the present invention. FIG. 11 is a diagram of the storage unit 54 without the storing component 84 according to the embodiment of the present invention. In the embodiment, each storage unit combining module 34 can load three storage units 54, such as the first storage unit 54A, the second storage unit 54B and the third storage unit 54C. The storage unit combining module 34 includes a base 56, a circuit backboard 58 and the signal adapter 72. The base 56 includes a first positioning zone 60, a second positioning zone 62, a third positioning zone 64 and an open zone 66, and defines a first inserting direction X and a second inserting direction Y crossed each other. The first inserting direction X is preferably perpendicular to the second inserting direction Y. As shown in FIG. 9, stretching directions of the first positioning zone 60 and the second positioning zone 62 are parallel to the first inserting direction X, and the first positioning zone 60 is neighbored with the second positioning zone 62 in the second inserting direction Y, so that the first positioning zone 60 and the second positioning zone 62 are respectively located on an upper position and a lower position. A stretching direction of the third positioning zone 64 is parallel to the second inserting direction Y and neighbored with the first positioning zone 60 and the second positioning zone 62 in the first inserting direction X, so the third positioning zone 64 is located on rear of the first positioning zone 60 and the second positioning zone 62, and the stretching direction of the third positioning zone 64 is perpendicular to the stretching directions of the first positioning zone 60 and the second positioning zone 62. The open zone 66 is neighbored with the third positioning zone 64.

The first positioning zone 60, the second positioning zone 62 and the third positioning zone 64 respectively are dotted patterns marked by arrows shown in FIG. 9. A long side of the positioning zone represents the lateral side, and a short side of the positioning zone represents the edge side. It is to say, the rear edge side indicates a lower reach (such like a connecting position) of each positioning zone according to the inserting direction, and the front edge side indicates an upper reach (such like an entering position) of each positioning zone according to the inserting direction.

The circuit backboard 58 is disposed on the base 56. The circuit backboard 58 is mainly composed on a first section 68 and a second section 70 bent from each other. Two sides of the first section 68 respectively face the right lateral side 641 of the third positioning zone 64 and the rear edge sides 602, 622 of the first positioning zone 60 and the second positioning zone 62. A side of the second section 70 faces the rear edge side 624 (which is different from the right lateral side 641) of the third positioning zone 64. A distal end of the second section 70 is located within the open zone 66. The signal adapter 72 is disposed on the open zone 66 and electrically connected to the second section 70 for connecting with the corresponding socket 46 of the RAID card 32. In another embodiment of the present invention, the RAID card 32 can be parallel to the bottom slab 38 and the signal adapter 72 moves downward to insert into the corresponding socket 46 of the RAID card 32. Generally, dimensions of the first positioning zone 60, the second positioning zone 62 and the third positioning zone 64 are identical, a length of the first section 68 may be shorter than a length of the second section 70, so that the circuit backboard 58 can be a L-shaped slab component, the first section 68 is a long section of the L-shaped slab component (the circuit backboard 58), and the second section 70 is a short section of the L-shaped slab component (the circuit backboard 58).

The circuit backboard 58 further includes a first connector 74, a second connector 76 and a third connector 78. The first connector 74 is disposed on a position of the first section 68 facing the first positioning zone 60. The second connector 76 is disposed on a position of the first section 68 facing the second positioning zone 62. The third connector 78 is disposed on a position of the second section 70 facing the third positioning zone 64. The first connector 74, the second connector 76 and the third connector 78 respectively are mid-mount connectors. The base 56 further can include a plurality of constraining components 80 respectively disposed on two opposite lateral sides of the first positioning zone 60, the second positioning zone 62 and the third positioning zone 64. The constraining components 80 of the position zones 60, 62, 64 are utilized to constrain a movement of the related storage units 54, which means the first storage unit 54A, the second storage unit 54B and the third storage unit 54C can be slidably assembled with or disassembled from the base 56 through the first positioning zone 60, the second positioning zone 62 and the third positioning zone 64 in the first inserting direction X and the second inserting direction Y, respectively.

As shown in FIG. 8 and FIG. 9, the first storage unit 54A and the second storage unit 54B are assembled with the first positioning zone 60 and the second positioning zone 62 in the first inserting direction X, and respectively connected to the first connector 74 and the second connector 76. The third storage unit 54C is assembled with the third positioning zone 64 in the second inserting direction Y different from the first inserting direction X, and connected to the third connector 78 accordingly. Thus, the first inserting direction X is substantially perpendicular to the second inserting direction Y, the stretching direction of the first section 68 can be substantially parallel to the second inserting direction Y, and the stretching direction of the second section 70 can be substantially parallel to the first inserting direction X.

As shown in FIG. 10 and FIG. 11, the storage unit 54 may include a supporting component 82, a storing component 84 and a detaching component 86. The storing component 84 can be a 2.5-inch hard disk, but not limited to, fixed on the supporting component 82. The detaching component 86 is disposed on an end of the supporting component 82. While the storage unit 54 slides into the base 56 via the constraining component 80, the detaching component 86 can be engaged with the base 56 to constrain a relative movement between the supporting component 82 and the constraining component 80, so as to prevent the storage unit 54 from being disassembled from the base 56. For repair and/or replacement of the storage unit 54, the detaching component 86 can be activated to unlock connection modes of the rear connectors 74, 76, 78, so as to disassemble the storage unit 54 from the positioning zone of the base 56. For instance, the first storage unit 54A and the second storage unit 54B can be pulled out of the carrying frame 30 through the front opening 301, and the third storage unit 54C can be pulled out of the carrying frame 30 through the top opening 302 for conveniently replacing the storing component 84, as shown in FIG. 4 to FIG. 7.

In conclusion, the housing 12 of the server apparatus 10 preferably can be universal standard, so that two storage unit moving suits 20 are loaded inside the bridging frame 18, and eight storage unit combining modules 34 are disposed inside each storage unit moving suit 20. The storage unit moving suit 20 is electrically connected to the mainboard 14 by the flexible cable 88, and the storage unit moving suit 20 can be pulled out of the bridging frame 18 via the slide rail structure 28 while the server apparatus 10 is in normal operation. The storage unit combining modules 34 are vertically disposed inside the storage unit moving suit 20 side by side. A gap is formed between the adjacent storage unit combining modules 34 for passing through the cooling airflow. The heat dissipating holes 44 on the carrying frame 30 respectively align with the storage units 54 of the storage unit combining modules 34 for preferred heat dissipation efficiency, and the storage unit combining module 34 of the present invention does not form vent holes on the circuit backboard 58 in the present invention.

For matching with the L-shaped circuit backboard 58 without the vent holes, the base 56 of the storage unit combining module 34 are divided into the first positioning zone 60, the second positioning zone 62 and the third positioning zone 64, and the L-shaped circuit backboard 58 is located between the first positioning zone 60, the second positioning zone 62 and the third positioning zone 64. The first storage unit 54A and the second storage unit 54B can be transversely inserted into the first positioning zone 60 and the second positioning zone 62 in the first inserting direction X, the third storage unit 54C can be vertically inserted into the third positioning zone 64 in the second inserting direction Y, and first storage unit 54A, the second storage unit 54B and the third storage unit 54C are respectively connected with the first connector 74, the second connector 76 and the third connector 78 of the L-shaped circuit backboard 58 to establish connection of the mainboard 14 via the RAID card 32; therefore, the storage unit combining module 34 can dispose the third storage unit 54C on redundant space between the bridging frame 18 and the heat dissipating module 16. Because each of the bridging frames 18 can load two storage unit moving suits 20, each of the storage unit moving suits 20 can load eight storage unit combining modules 34, and each of the storage unit combining modules 34 can load three storage units 54, so that the storage unit moving suit 20 has twenty-four storage units 54 at most and the server apparatus 10 can simultaneously have forty-eight storage units 54. The present invention increases loading amounts of the storage unit 54 without changing volume and specification of the server apparatus 10. The present invention is not limited to the above-mentioned embodiment that the bridging frames 18 has two storage unit moving suits 20 and the storage unit moving suit 20 has eight storage unit combining modules 34, and further can be applied to the server apparatus with one or more than two storage unit moving suits, or applied to the server apparatus that includes the single storage unit moving suit having the storage unit combining module with other numeral.

Comparing to the prior art, the storage unit combining module and the related storage unit moving suit of the present invention can increase the loading amounts of the storage unit while volume of the server apparatus is unvaried. The circuit backboard of the storage unit combining module does not have the vent holes to increase circuit allocation space on the circuit backboard. The hard disk connector, the power connector and the signal connector are not disposed on two surfaces of the circuit backboard, and the single-sided product process can be applied to effectively economize manufacture cost of the circuit backboard. The storage unit moving suit is connected to the mainboard by the flexible cable, so the storage unit moving suit can be pulled out and pushed into the housing for replacement of the storage units while the server apparatus is in normal operation. Each storage unit combining module is matched with three storage units, and a quantity of the hard disks within the server apparatus can be highly changeable for customized demand.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A storage unit combining module capable of simultaneously loading a first storage unit, a second storage unit and a third storage unit, the storage unit combining module comprising: a base, the base comprising a first positioning zone, a second positioning zone and a third positioning zone and defining a first inserting direction and a second inserting direction crossed each other, stretching directions of the first positioning zone and the second positioning zone being parallel to the first inserting direction and the first positioning zone being neighbored with the second positioning zone in the second inserting direction, a stretching direction of the third positioning zone being parallel to the second inserting direction and neighbored with identical lateral sides of the first positioning zone and the second positioning zone in the first inserting direction, wherein the first inserting direction is substantially perpendicular to the second inserting direction; and a circuit backboard disposed on the base, the circuit backboard comprising a first section and a second section connected to each other, the first section being located between the third positioning zone and the identical lateral sides of the first positioning zone and the second positioning zone and stretching toward a direction opposite to the second inserting direction, the second section stretching toward the first inserting direction and being neighbored with a side of the third positioning zone, the circuit backboard comprising: a first connector disposed on a position of the first section neighbored with and facing the first positioning zone; a second connector disposed on a position of the first section neighbored with and facing the second positioning zone; a third connector disposed on a position of the second section neighbored with and facing the third positioning zone; and a signal adapter for connecting with a pass-through interface card; wherein, the first storage unit is adapted to connect with the first connector in the first inserting direction through the first positioning zone, the second storage unit is adapted to connect with the second connector in the first inserting direction through the second positioning zone, and the third storage unit is adapted to connect with the third connector in the second inserting direction through the third positioning zone, wherein each of the first storage unit, the second storage unit and the third storage unit comprises a storing component having same size and form factor.

2. The storage unit combining module of claim 1, wherein the base comprises a plurality of constraining components respectively disposed on two opposite lateral sides of the first positioning zone, the second positioning zone and the third positioning zone, to constrain movements of the first storage unit, the second storage unit and the third storage unit except moving in the first inserting direction and the second inserting direction.

3. The storage unit combining module of claim 2, wherein the first storage unit comprises a supporting component, the storing component and a detaching component, the storing component and the detaching component are disposed on the supporting component, the supporting component slides relative to the base via the constraining components and is engaged with the base by the detaching component to constrain a relative movement between the supporting component and the constraining components.

4. The storage unit combining module of claim 1, wherein the circuit backboard is a L-shaped slab component, the first section is a long section of the L-shaped slab component, and the second section is a short section of the L-shaped slab component.

5. The storage unit combining module of claim 1, wherein the first connector, the second connector and the third connected are mid-mount connectors.

6. A storage unit moving suit, comprising: a carrying frame, having an accommodating space; a pass-through interface card disposed on a side of the carrying frame; and at least one storage unit combining module disposed inside the accommodating space of the carrying frame and capable of simultaneously loading a first storage unit, a second storage unit and a third storage unit, the at least one storage unit combining module comprising: a base, the base comprising a first positioning zone, a second positioning zone and a third positioning zone and defining a first inserting direction and a second inserting direction crossed each other, stretching directions of the first positioning zone and the second positioning zone being parallel to the first inserting direction and the first positioning zone being neighbored with the second positioning zone in the second inserting direction, a stretching direction of the third positioning zone being parallel to the second inserting direction and neighbored with identical lateral sides of the first positioning zone and the second positioning zone in the first inserting direction, wherein the first inserting direction is substantially perpendicular to the second inserting direction; and a circuit backboard disposed on the base, the circuit backboard comprising a first section and a second section connected to each other, the first section being located between the third positioning zone and the identical lateral sides of the first positioning zone and the second positioning zone and stretching toward a direction opposite to the second inserting direction, the second section stretching toward the first inserting direction and being neighbored with a side of the third positioning zone, the circuit backboard comprising: a first connector disposed on a position of the first section neighbored with and facing the first positioning zone; a second connector disposed on a position of the first section neighbored with and facing the second positioning zone; a third connector disposed on a position of the second section neighbored with and facing the third positioning zone; and a signal adapter for connecting with the pass-through interface card; wherein, the first storage unit is adapted to connect with the first connector in the first inserting direction through the first positioning zone, the second storage unit is adapted to connect with the second connector in the first inserting direction through the second positioning zone, and the third storage unit is adapted to connect with the third connector in the second inserting direction through the third positioning zone, wherein each of the first storage unit, the second storage unit and the third storage unit comprises a storing component having same size and form factor.

7. The storage unit moving suit of claim 6, wherein the base comprises a plurality of constraining components respectively disposed on two opposite lateral sides of the first positioning zone, the second positioning zone and the third positioning zone, to constrain movements of the first storage unit, the second storage unit and the third storage unit except moving in the first inserting direction and the second inserting direction.

8. The storage unit moving suit of claim 7, wherein the first storage unit comprises a supporting component, the storing component and a detaching component, the storing component and the detaching component are disposed on the supporting component, the supporting component slides relative to the base via the constraining components and is engaged with the base by the detaching component to constrain a relative movement between the supporting component and the constraining components.

9. The storage unit moving suit of claim 6, wherein the circuit backboard is a L-shaped slab component, the first section is a long section of the L-shaped slab component, and the second section is a short section of the L-shaped slab component.

10. The storage unit moving suit of claim 6, wherein the first connector, the second connector and the third connected are mid-mount connectors.

11. The storage unit moving suit of claim 6, wherein the carrying frame comprises at least one guiding slot, the at least one storage unit combining module utilizes the at least one guiding slot to slidably dispose inside the accommodating space of the carrying frame.

12. The storage unit moving suit of claim 11, wherein the carrying frame further comprises a bottom slab, two lateral slabs and two blocking slabs, the two lateral slabs are respectively connected to two sides of the bottom slab, the two blocking slabs are respectively crossed between the two lateral slabs, the at least one guiding slot is disposed on the bottom slab and/or one of the two blocking slabs.

13. The storage unit moving suit of claim 12, wherein a plurality of heat dissipating holes is respectively formed on the two blocking slabs and/or the bottom slab.

14. The storage unit moving suit of claim 6, wherein the carrying frame further comprises a handling component.

15. The storage unit moving suit of claim 6, wherein a plurality of sockets is disposed on a surface of the pass-through interface card for connecting with the signal adapter, an amount of the socket corresponds to an amount of the storage unit combining module.

16. The storage unit moving suit of claim 6, wherein the pass-through interface card is a RAID (redundant array of independent disks) card.

17. The storage unit moving suit of claim 6, wherein the pass-through interface card further comprises a power connector and a signal connector electrically connected to a mainboard of a server apparatus via a flexible cable.

18. A server apparatus, comprising: a housing; a mainboard disposed inside the housing; and at least one storage unit moving suit disposed inside the housing and capable of being pulled or pushed relative to the housing, the at least one storage unit moving suit comprising: a carrying frame, having an accommodating space; a pass-through interface card disposed on a side of the carrying frame; and at least one storage unit combining module disposed inside the accommodating space of the carrying frame and capable of simultaneously loading a first storage unit, a second storage unit and a third storage unit, the at least one storage unit combining module comprising: a base, the base comprising a first positioning zone, a second positioning zone and a third positioning zone and defining a first inserting direction and a second inserting direction crossed each other, stretching directions of the first positioning zone and the second positioning zone being parallel to the first inserting direction and the first positioning zone being neighbored with the second positioning zone in the second inserting direction, a stretching direction of the third positioning zone being parallel to the second inserting direction and neighbored with identical lateral sides of the first positioning zone and the second positioning zone in the first inserting direction, wherein the first inserting direction is substantially perpendicular to the second inserting direction; and a circuit backboard disposed on the base, the circuit backboard comprising a first section and a second section connected to each other, the first section being located between the third positioning zone and the identical lateral sides of the first positioning zone and the second positioning zone and stretching toward a direction opposite to the second inserting direction, the second section stretching toward the first inserting direction and being neighbored with a side of the third positioning zone, the circuit backboard comprising: a first connector disposed on a position of the first section neighbored with and facing the first positioning zone; a second connector disposed on a position of the first section neighbored with and facing the second positioning zone; a third connector disposed on a position of the second section neighbored with and facing the third positioning zone; and a signal adapter for connecting with the pass-through interface card; wherein, the first storage unit is adapted to connect with the first connector in the first inserting direction through the first positioning zone, the second storage unit is adapted to connect with the second connector in the first inserting direction through the second positioning zone, and the third storage unit is adapted to connect with the third connector in the second inserting direction through the third positioning zone, wherein each of the first storage unit, the second storage unit and the third storage unit comprises a storing component having same size and form factor.

19. The server apparatus of claim 18, wherein the base comprises a plurality of constraining components respectively disposed on two opposite lateral sides of the first positioning zone, the second positioning zone and the third positioning zone, to constrain movements of the first storage unit, the second storage unit and the third storage unit except moving in the first inserting direction and the second inserting direction.

20. The server apparatus of claim 19, wherein the first storage unit comprises a supporting component, the storing component and a detaching component, the storing component and the detaching component are disposed on the supporting component, the supporting component slides relative to the base via the constraining components and is engaged with the base by the detaching component to constrain a relative movement between the supporting component and the constraining components.

21. The server apparatus of claim 18, wherein the circuit backboard is a L-shaped slab component, the first section is a long section of the L-shaped slab component, and the second section is a short section of the L-shaped slab component.

22. The server apparatus of claim 18, wherein the first connector, the second connector and the third connected are mid-mount connectors.

23. The server apparatus of claim 18, wherein the carrying frame comprises at least one guiding slot, the at least one storage unit combining module utilizes the at least one guiding slot to slidably dispose inside the accommodating space of the carrying frame.

24. The server apparatus of claim 23, wherein the carrying frame further comprises a bottom slab, two lateral slabs and two blocking slabs, the two lateral slabs are respectively connected to two sides of the bottom slab, the two blocking slabs are respectively crossed between the two lateral slabs, the at least one guiding slot is disposed on the bottom slab and/or one of the two blocking slabs.

25. The server apparatus of claim 24, wherein a plurality of heat dissipating holes is respectively formed on the two blocking slabs and/or the bottom slab.

26. The server apparatus of claim 18, wherein the carrying frame further comprises a handling component.

27. The server apparatus of claim 18, wherein a plurality of sockets is disposed on a surface of the pass-through interface card for connecting with the signal adapter, an amount of the socket corresponds to an amount of the storage unit combining module.

28. The server apparatus of claim 18, wherein the pass-through interface card further comprises a power connector and a signal connector electrically connected to the mainboard via a flexible cable.

29. The server apparatus of claim 18, wherein the pass-through interface card is a RAID (redundant array of independent disks) card.

30. The server apparatus of claim 18, further comprising:
a bridging frame disposed inside the housing, a plurality of storage unit moving suits being detachably loaded inside the bridging frame.

31. The server apparatus of claim 30, further comprising:
a slide rail structure disposed between the carrying frame and the bridging frame, the plurality of storage unit moving suits being pulled or pushed relative to the housing via the slide rail structure.

* * * * *